United States Patent
Chong

(10) Patent No.: US 9,490,607 B2
(45) Date of Patent: Nov. 8, 2016

(54) EXTERNAL CAVITY LASER WITH SINGLE MODE-HOP-FREE TUNING

(71) Applicant: Santec Corporation, Komaki, Aichi (JP)

(72) Inventor: Changho Chong, Los Altos, CA (US)

(73) Assignee: SANTEC CORPORATION, Aichi (JP)

(*) Notice: Subject to any disclaimer, the term of this patent is extended or adjusted under 35 U.S.C. 154(b) by 0 days.

(21) Appl. No.: 14/641,200

(22) Filed: Mar. 6, 2015

(65) Prior Publication Data

US 2015/0255953 A1  Sep. 10, 2015

Related U.S. Application Data

(60) Provisional application No. 61/949,453, filed on Mar. 7, 2014.

(51) Int. Cl.

| | |
|---|---|
| H01S 3/10 | (2006.01) |
| H01S 5/10 | (2006.01) |
| H01S 5/14 | (2006.01) |
| H01S 5/343 | (2006.01) |
| H01S 5/30 | (2006.01) |
| H01S 5/125 | (2006.01) |
| H01S 5/12 | (2006.01) |

(52) U.S. Cl.
CPC ........... *H01S 5/1039* (2013.01); *H01S 5/1212* (2013.01); *H01S 5/141* (2013.01); *H01S 5/1014* (2013.01); *H01S 5/1032* (2013.01); *H01S 5/125* (2013.01); *H01S 5/1231* (2013.01); *H01S 5/3013* (2013.01); *H01S 5/34306* (2013.01)

(58) Field of Classification Search
CPC .. H01S 5/143; H01S 5/34306; H01S 5/3013; H01S 5/1039; H01S 5/125
See application file for complete search history.

(56) References Cited

U.S. PATENT DOCUMENTS

| | | | | |
|---|---|---|---|---|
| 5,982,963 | A * | 11/1999 | Feng | G02B 6/02085 359/290 |
| 6,160,826 | A | 12/2000 | Swanson et al. | |
| 2002/0163948 | A1* | 11/2002 | Yoshida et al. | 372/45 |
| 2006/0109872 | A1* | 5/2006 | Sanders | 372/19 |
| 2006/0215713 | A1* | 9/2006 | Flanders et al. | 372/20 |
| 2007/0133647 | A1* | 6/2007 | Daiber | 372/99 |
| 2009/0022181 | A1* | 1/2009 | Atkins et al. | 372/6 |
| 2009/0290613 | A1* | 11/2009 | Zheng | H01S 5/146 372/99 |
| 2010/0246612 | A1* | 9/2010 | Shimizu | 372/18 |

OTHER PUBLICATIONS

Fainman, Y. et al., "Nanophotonics for Information Systems," Information Optics and Photonics (T. Fournel and B. Javidi eds., Springer New York, 2010) pp. 13-37.
Sarlet, G. et al., "Wavelength and Mode Stabilization of Widely Tunable SG-DBR and SSG-DBR Lasers," IEEE Photonics Technology Letters, vol. 11, No. 11, Nov. 1999, pp. 1351-1353.
Segawa, Toru et al., "Semiconductor Double-Ring-Resonator-Coupled Tunable Laser for Wavelength Routing," IEEE Journal of Quantum Electronics, vol. 45, No. 7, Jul. 2009, pp. 892-899.
International Search Report and Written Opinion in International Application No. PCT/US2015/19299 dtd Nov. 2, 2015 (10 pages).

\* cited by examiner

*Primary Examiner* — Yuanda Zhang
(74) *Attorney, Agent, or Firm* — Foley & Lardner LLP

(57) ABSTRACT

External cavity lasers with single mode-hop-free tuning are generally described. In an example, an external cavity tunable laser system includes an external cavity, a substrate, a chirped grating reflector, and a tunable filter. The substrate has a gain region disposed on the substrate and also includes an active waveguide. The external cavity tunable laser system has a cavity length of the external cavity tunable laser system that is defined by at least a first length of the chirped grating reflector, a second length of the gain region, and a third length of the tunable filter. The cavity length also has an inherent external cavity longitudinal mode. Further, the tunable filter and the chirped grating reflector are configured to synchronize to the inherent external cavity longitudinal mode over a tuning range of the tunable filter.

20 Claims, 8 Drawing Sheets

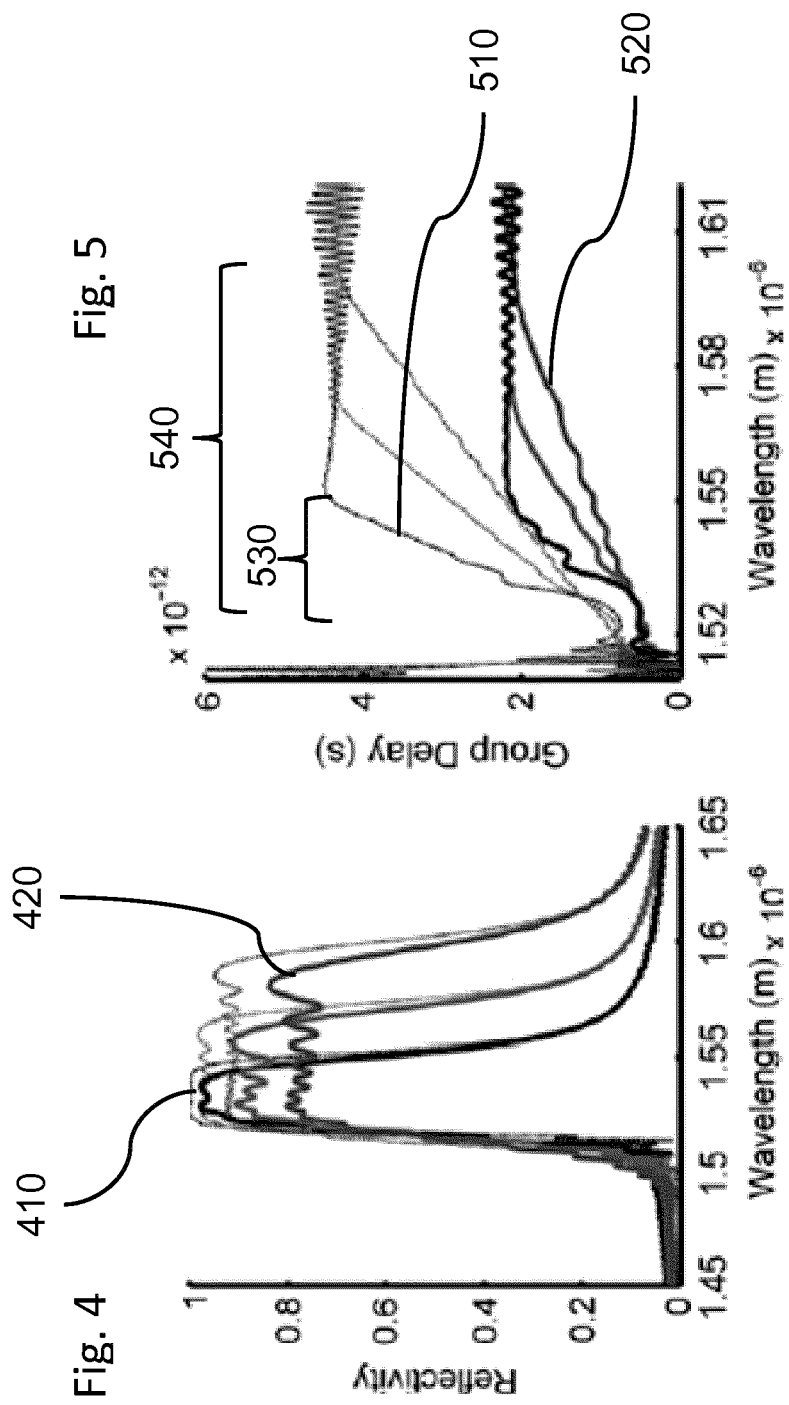

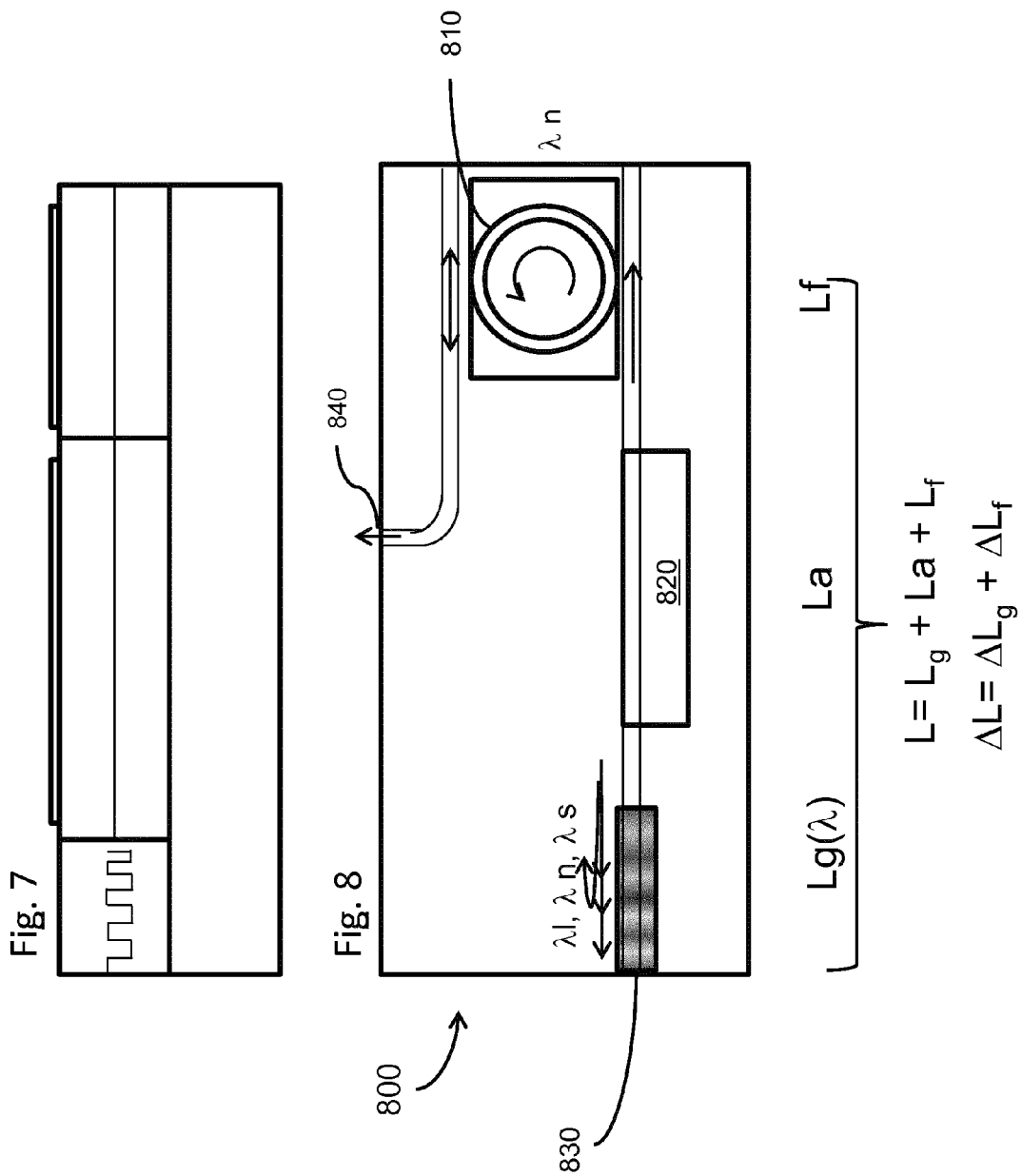

EXTERNAL CAVITY LASER WITH SINGLE MODE-HOP-FREE TUNING

CROSS-REFERENCE TO RELATED APPLICATIONS

This application claims priority to U.S. Provisional Application No. 61/949,453, filed Mar. 7, 2014, which is incorporated herein by reference in its entirety for any and all purposes.

BACKGROUND

The following description is provided to assist the understanding of the reader. None of the information provided or references cited is admitted to be prior art.

Traditionally, a laser has three main components: an excitation source, an active medium, and a laser cavity. The excitation source is often an energy source such as light, heat, or current. The excitation source excites electrons in the active medium, and upon decay the electrons in the medium emit energy in the form of a light photon. An external cavity laser is a laser with optical elements external to the active medium that either form a laser cavity or form part of a laser cavity. A laser cavity serves as a resonator for the light photons in the cavity. Generally, a resonator is used in a laser to make the light emitted from a laser coherent. If a light beam from a laser is perfectly coherent, all the light will propagate in the same direction, will have the same wavelength, and will have the same phase. This is the ultimate goal of a laser's resonator, though perfect coherence is not generally achievable. In order to form coherent light, the intrinsic properties of a cavity allow only particular wavelengths to resonate in the cavity. If there are photons emitted by the active medium that align with the resonant traits of the cavity, those photons will not continue to propagate within the cavity. While the photons of the particular wavelength of the cavity (and the wavelengths of other integral multiples of the cavity) propagate, constructive interference of the photons boosts the amplitude of the waves within the cavity. The wavelengths emitted by a certain type of active medium are often a function of the type of active medium and the type and intensity of the excitation source. Thus, a laser cavity should be constructed to match the wavelengths emitted by the active medium in order for the laser to function properly.

SUMMARY

In an embodiment, the present technology provides an improved external cavity tunable laser system with single mode-hop-free tuning that includes an external cavity, a substrate, a chirped grating reflector, and a tunable filter. The substrate has a gain region disposed on the substrate and also includes an active waveguide. The external cavity tunable laser system has a cavity length of the external cavity tunable laser system that is defined by at least a first length of the chirped grating reflector, a second length of the gain region, and a third length of the tunable filter. The cavity length also has an inherent external cavity longitudinal mode. Further, the tunable filter and the chirped grating reflector are configured to synchronize to the inherent external cavity longitudinal mode over a tuning range of the tunable filter.

An illustrative method includes generating light in an external cavity. The light has a wavelength and the external cavity has a cavity length. The method also includes amplifying the light at a gain region disposed on a substrate. The method also includes reflecting the light at a chirped grating reflector. The method also includes tuning a tunable filter such that the light is synchronized according to an inherent external cavity longitudinal mode of the external cavity. The external cavity includes a cavity length defined by at least a first length of the chirped grating reflector, a second length of the gain region, and a third length of the tunable filter. The tunable filter and the chirped grating reflector are configured to synchronize to the inherent external cavity longitudinal mode over a tuning range of the tunable filter.

The foregoing summary is illustrative only and is not intended to be in any way limiting. In addition to the illustrative aspects, embodiments, and features described above, further aspects, embodiments, and features will become apparent by reference to the following drawings and the detailed description.

BRIEF DESCRIPTION OF THE DRAWINGS

The foregoing and other features of the present disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings.

FIG. 4 depicts a graph showing the reflectivity of different chirped mirrors at particular wavelengths in accordance with an illustrative embodiment.

FIG. 5 depicts a graph showing delay in time of the reflection of particular wavelengths in different chirped mirrors in accordance with an illustrative embodiment.

FIG. 7 depicts a representation of an external cavity laser that uses a tunable ring filter in accordance with an illustrative embodiment.

FIG. 8 depicts a representation of an external cavity laser that uses a tunable ring filter in accordance with an illustrative embodiment.

DETAILED DESCRIPTION

Figure 1:
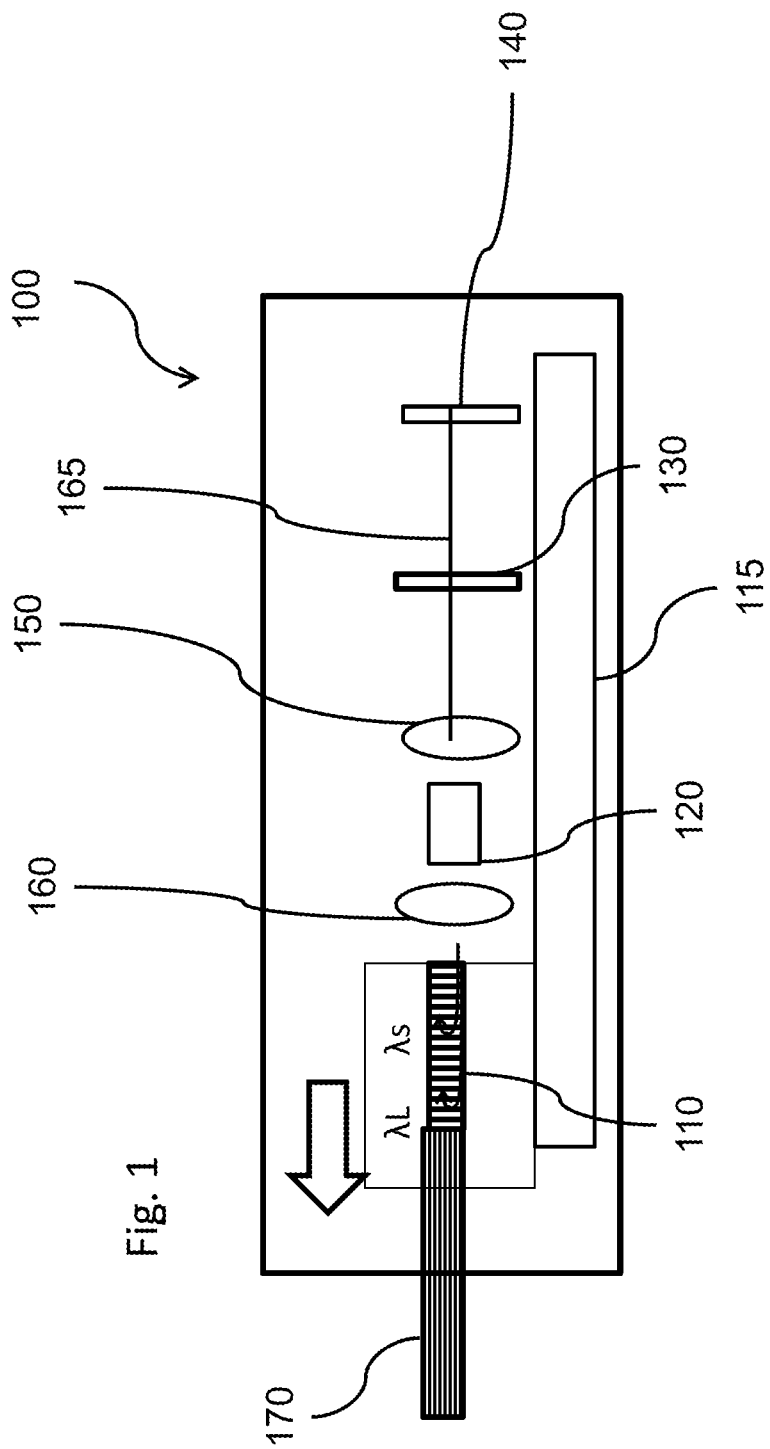
FIG. 1 depicts a representation of an external cavity laser that incorporates a chirped mirror and a tunable filter in accordance with an illustrative embodiment.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and make part of this disclosure.

Described herein is an external cavity laser that uses a linearly chirped mirror to synchronize an external cavity with a tunable filter, allowing for continuous single mode-hop-free tuning.

FIG. 1 depicts a representation of an external cavity laser 100 that incorporates a chirped mirror 110 and a tunable filter 130 in accordance with an illustrative embodiment. The tunable filter 130 adjusts the cavity length of the external cavity or the wavelengths passing through the cavity (and therefore can adjusts what wavelength is needed to resonate within the cavity or adjust the wavelengths to fit the length of the cavity). Area 115 roughly demonstrates the length of the tunable external cavity. A gain chip 120 serves as the active medium and is the source of the stimulated photons introduced into the laser 100. The photons generated by the gain chip 120 pass through a lens 150 and the tunable filter 130 and are reflected off of a mirror 140, as generally shown along a path 165. After reflecting off of the mirror 140, the photons pass back through the tunable filter 130 and the lens 150 and back through the gain chip 120. The light passing through the gain chip 120 then goes through another lens 160 and into the chirped mirror 110. The chirped mirror 110 is a mirror having chirped spaces that vary in depth in a manner designed to reflect varying wavelengths of light. In an embodiment, the chirped mirror 110 may include a plurality of dielectric layers, wherein the chirped spaces are located between the dielectric layers. In this embodiment, the chirped mirror 110 is a linearly chirped mirror that will reflect certain wavelengths, for example $\lambda_s$ may be the shortest wavelength the chirped mirror 110 reflects and $\lambda_L$ may be the longest wavelength the chirped mirror 110 reflects. The chirped mirror 110 will also reflect the wavelengths between $\lambda_s$ and $\lambda_L$. Any wavelength not within that range may not be reflected by the chirped mirror 110. As a result, only the appropriate wavelengths within the cavity will be propagated and will allow the wavelengths in the cavity to resonate properly. An emitted laser 170 is also shown in FIG. 1.

The chirped mirror 110 can be designed in many ways, but here it is shown in a linear configuration. With a linearly chirped mirror, the wavelengths between $\lambda_s$ and $\lambda_L$ are reflected back at different locations within the chirped mirror 110. At one location in the chirped mirror 110 wavelengths of $\lambda_s$ will be reflected. The location where light is reflected in the chirped mirror 110 is linearly related to the wavelength of the light. In other words, as the wavelength linearly increases, the physical point in the chirped mirror 110 where light is reflected increases as well. Using this configuration, the tunable filter 130 can be adjusted to change the cavity length of the external cavity to match a wavelength being output by the gain chip 120. In another embodiment, the tunable filter 130 may adjust the wavelength of the light in the cavity. As long as the output wavelength is within the range reflected by the chirped mirror 110, synchronization can occur between the wavelength and the length of the cavity.

Synchronization is further accomplished because of the configuration of the linearly chirped mirror 110. Since the reflection of a particular wavelength happens at a particular point in the chirped mirror 110, different cavity lengths will be effected by the chirped mirror 110 depending on the wavelength that is propagated within the cavity. Thus, when using the chirped mirror 110, the optical cavity length adjusts according to the setting of the tunable filter 130 and the wavelengths being propagated in the cavity. This allows for simple tuning that can be effective over a continuous range without having to physically adjust any component of the external cavity. Additionally, this tuning can be effected without the use of multiple modes to cover a tunable range. Stated another way, the chirped mirror 110 and the tunable filter 130 allow for single external cavity longitudinal mode synchronization over a wide range of wavelengths. This system thereby allows realization of continuous single mode-hop-free tuning.

Figure 2:
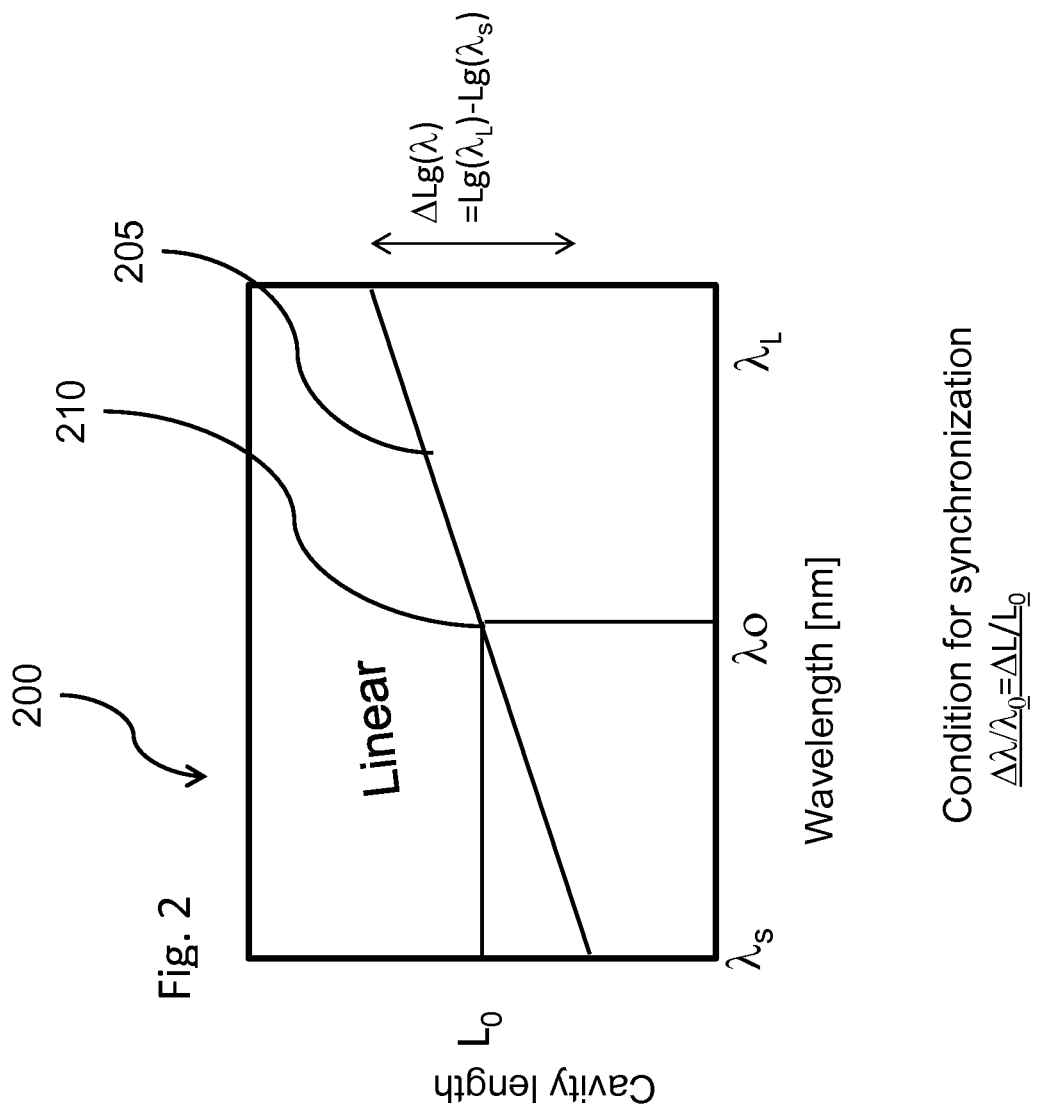
FIG. 2 depicts a graph that demonstrates the relationship between the cavity length and wavelength for achieving synchronization in accordance with an illustrative embodiment.

FIG. 2 depicts a graph 200 that demonstrates the relationship between the cavity length and wavelength for achieving synchronization in accordance with an illustrative embodiment. As the wavelength increases, so too must the cavity length in order to achieve synchronization. Thus, using a tunable filter and linearly chirped mirror to effect a variable cavity length, a laser can be tuned to a specific wavelength $\lambda_0$ as depicted. For example, in an illustrative embodiment, the external cavity laser 100 shown in FIG. 1 has the chirped mirror 110 that can reflect wavelengths between $\lambda_s$ and $\lambda_L$. Similarly, the external cavity laser 100 may also be tuned across that range of wavelengths. When the length of a cavity equals the wavelength of light in the cavity, synchronization is accomplished. (In an alternative embodiment, the length of the cavity may also equal an integral multiple of the wavelength to accomplish synchronization.) Since a chirped mirror, such as the linearly chirped mirror 110, reflects different wavelengths at different points in physical space, a laser accomplish synchronization across a range of wavelengths without adjusting any physical component of the laser. That is, the wavelength may change within the range that is reflected by the chirped mirror and the laser will still achieve synchronization. Accordingly, the effective length of the cavity changes along with the wavelength due to the properties of the chirped mirror.

FIG. 2 generally shows the linear relationship between cavity length and wavelength for accomplishing synchronization. As the wavelength increases, the so should the cavity length in order to accomplish synchronization. The points at which synchronization might be accomplished is represented by a line 205. Accordingly, at a point 210 where the wavelength is $\lambda_O$ and the cavity length is $L_O$ synchronization can be accomplished. The embodiments disclosed herein provide a tunable external cavity that can achieve synchronization across a wide range of wavelengths without physically adjusting the cavity.

Figure 3:
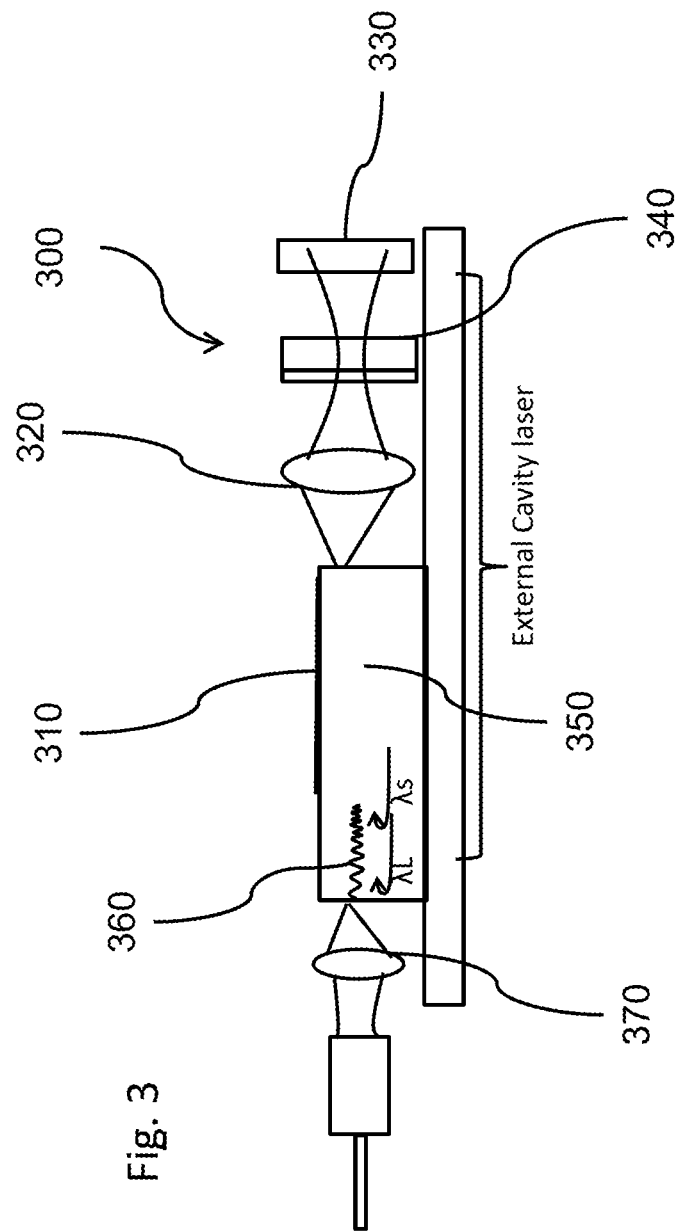
FIG. 3 depicts a representation of an external cavity laser that incorporates the gain area and a chirped bragg grating in the same integrated chip in accordance with an illustrative embodiment.

FIG. 3 depicts a representation of an external cavity laser 300 that incorporates a gain area 350 and a chirped bragg grating 360 in the same integrated chip 310 in accordance with an illustrative embodiment. In this embodiment the gain area 350 and the chirped bragg grating 360 are integrated into one physical component. In an illustrative embodiment, the chirped bragg grating 360 may behave similarly to the chirped mirror discussed above with respect to FIG. 1. In this case, the wavelengths of light generated by the gain area 350 pass through a lens 320 and a tunable filter 340. The wavelengths are then reflected off of a mirror 330 and pass back through the lens 320 and the tunable filter 340. The wavelengths will pass back through the gain area 350 and into the chirped bragg grating 360. Here the wavelengths will be reflected by the chirped bragg grating 360 and propagated back through the external cavity of the external cavity laser 300. The output of the laser comes out of the integrated chip 310 and passes through a lens 370.

FIG. 4 depicts a graph showing the reflectivity of different chirped mirrors at particular wavelengths in accordance with an illustrative embodiment. This graph is shown in Information Optics and Photonics: Algorithms, Systems, and Applications by T. Fournel and B. Javidi, which is incorporated herein by reference. The graph demonstrates the properties of various chirped mirrors in the art. Each line on the graph represents the properties of a different mirror. This graph shows what ranges of wavelength are reflected by each mirror, and to what level there is reflectivity at those wavelengths. For example, line 410 shows a mirror with a high relative reflectivity (almost 1 on the graph). A higher reflectivity mirror may benefit a laser by making it highly resonant. However, the mirror associated with the line 410 has a relatively (compared to the other lines on the graph) narrow range of frequencies at which the mirror demonstrates that high reflectivity. Thus, where the mirror associated with the line 410 may not calibrate over as wide a region of wavelengths. A line 420 shows a line associated with a different mirror. The line 420 shows a lower reflectivity than the line 410, but shows a much larger wavelength range across which the mirror still has substantial reflectivity.

FIG. 5 depicts a graph showing delay in time of the reflection of particular wavelengths in different chirped mirrors in accordance with an illustrative embodiment. Here, a particular mirror has the linear chirped pattern desired for the embodiments shown in FIG. 1 and FIG. 3. This graph shows the delay of reflection for varying wavelengths. The delay is measured from the time the light enters the mirror. Thus, the position of reflection is implicated if the delay of reflection for a given wavelength is longer. In other words, different mirrors are configured to have different effective lengths depending on how they reflect back varying wavelengths. As shown in FIG. 5, different mirrors may be configured differently to reflect different ranges of wavelength, reflect them more slowly or quickly, Each of these factors depends on the physical configuration of each mirror. For example, a mirror associated with a line 510 reflects a relatively narrow band 530 of wavelengths compared to the other lines in FIG. 5, but delivers higher variability in delay times for the reflected wavelengths. In contrast, a mirror associated with a line 520 reflects a larger range 540 of wavelengths, but with relatively less variability in delay times.

Figure 6B:
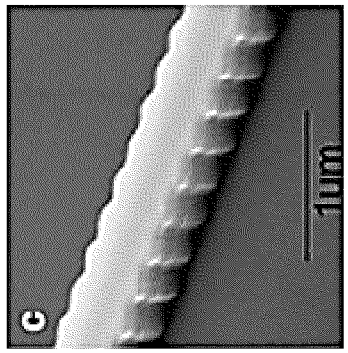
FIGS. 6A-6D depict chirped Bragg grating devices in accordance with illustrative embodiments.
Figure 6C:
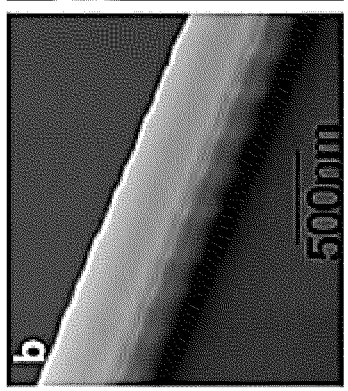
Figure 6A:
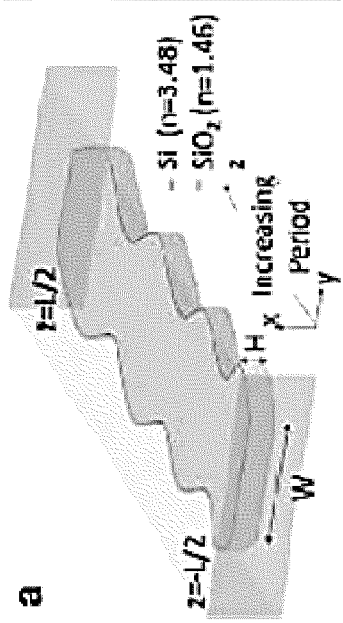

FIGS. 6a-6d depict chirped Bragg grating devices in accordance with illustrative embodiments. The depiction FIG. 6a indicates how different wavelengths are reflected at different points within the mirror or grating device. That is, as the variable z increases, the wavelength reflected increases as disclosed herein. FIG. 6a is a bird's eye view of a chirped Bragg grating device geometry realized with a sidewall modulated photonic nano-wire.

Figure 6D:
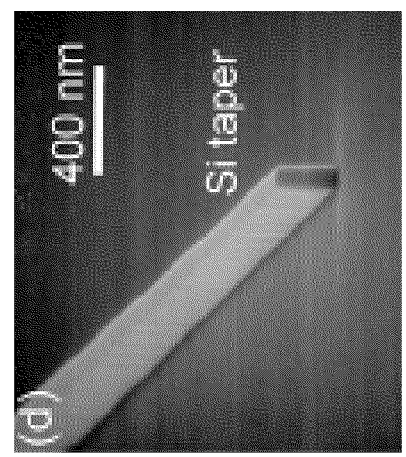

FIGS. 6b and 6c show scanning electron microscope (SEM) micrographs of an apodized section of a chirped Bragg grating device (FIG. 6b) and an unapodized section before silicon oxide ($SiO_2$) cladding deposition (FIG. 6c). FIG. 6d shows another SEM micrograph of a chirped Bragg grating device with a silicon taper.

FIG. 7 depicts a representation of an external cavity laser that uses a tunable ring filter in accordance with still another illustrative embodiment. This depiction gives a visual indication of the schematic shown in FIG. 8, discussed below.

FIG. 8 depicts a representation of an external cavity laser 800 that uses a tunable ring filter 810 in accordance with an illustrative embodiment. In this embodiment, the tunable filter is a tunable ring filter 810. With the tunable ring filter 810, the photons pass through the rings of the filter. By adjusting the tunable ring filter 810, the path length that the photons must follow changes. In other words, the path the light follows can be shortened or lengthened by the tunable ring filter 810. The gain section 820 and chirped grating reflector 830 (or chirped mirror) operate similar to those in FIG. 1 and FIG. 3. Here, the changing cavity lengths are also demonstrated which allow for tuning the laser and achieving synchronization. The cavity length L is defined by three things: 1) the length ($L_g$) that the light that passes through the chirped grating reflector 830, which is dependent on the particular wavelength of the light; 2) the inherent length ($L_a$) of the gain section 820; and 3) the length ($L_f$) of the path through the tunable ring filter 810, which is also variable. Therefore, both the length of the tunable ring filter 810 and the length of the chirped grating reflector 830 can change. In order to achieve synchronization to account for a change in wavelength of the light in the cavity, the combined change of the length ($L_f$) of the tunable ring filter 810 and the length ($L_g$) of the chirped grating reflector 830 should be adjusted based on the change in wavelength. This is demonstrated by FIG. 9 discussed below. FIG. 8 also includes a partial mirror 840, which allows some light to pass through outside of the laser and reflects some of the light back into the cavity. Accordingly, a tunable laser as demonstrated in FIG. 8 may be tuned by adjusting the wavelength of the light in the cavity and/or tuned by adjusting the ring filter 810 to change the length of the path through which the light travels. Both of these adjustments occur without having to adjust the physical orientation or configuration of the components shown in FIG. 8.

A ring cavity filter tunes wavelengths by virtue of a refractive index change of the ring area cascaded to the gain area when used in combination with a chirped grating reflector. In order to synchronize the phase of the cavity longitudinal mode and the wavelength of the tunable filter over the tuning range, the rate of cavity length change to total cavity length should be proportional to the rate of wavelength change to center wavelength. This change can be factored by the chirp length of the chirped grating reflector to change the position of reflection, thus changing the cavity length. When the optical cavity length equals the wavelength (or an integral multiple of the wavelength) of the light in the cavity, the cavity longitudinal mode and the wavelength of the tunable filter have been synchronized.

In another embodiment, a MEMS (micro-electro-mechanical system) tunable filter may be inserted in the cavity between the semiconductor chip and the mirror. The semiconductor device is integrated with an active gain region and a chirped grating reflector. The MEMS tunable filter (Fabry-Perot) changes wavelength, but the MEMS tunable filter does not change the optical path length during tuning within the device. Accordingly, the chirp of grating reflector can be simply first order or linear in order to meet the condition of mode synchronization. In this embodiment, rather than changing the path length like the ring filter did, the MEMS tunable filter adjusts the wavelength being resonated in the cavity, but the chirped grating still allows for a wider range of cavity lengths and acceptable wavelengths to make the laser work.

If an embodiment is realized in a compact foot print by integrating or monolithically integrating all elements, longitudinal mode separation becomes large enough, thereby eliminating the need for a high finesse of tunable filter. Accordingly, there is no need to use the Vernier effect with two cascaded ring filters or sampled Bragg gratings in order to make stable single lasing. Consequently, one can achieve wide tuning range continuously with a single filter. Also, a large longitudinal mode range is possible with various embodiments disclosed herein. Thus, the range of wavelengths that make a laser work in a single mode is large. In other words, there is increased single mode selectivity, and the increase creates a more stable single mode oscillation because the laser can handle wider ranges of wavelengths in a single mode.

Figure 9:
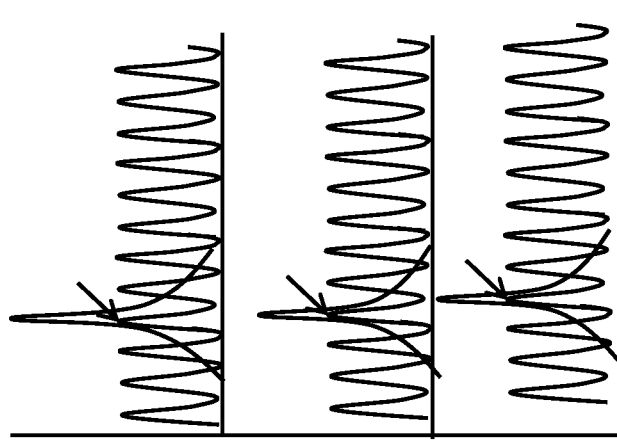
FIG. 9 depicts a graph demonstrating the synchronization conditions for an external cavity laser like the one shown in FIG. 8 in accordance with an illustrative embodiment.

FIG. 9 depicts a graph demonstrating the synchronization conditions for an external cavity laser like the one shown in FIG. 8 in accordance with an illustrative embodiment. In other words, a change in cavity length ($L_0$) is represented by the change in space a wave is traveling through the grating ($L_g(\lambda)$), which is a function of the wavelength, as well as the change in length ($L_f$) based on an adjustment to a ring filter or MEMS filter. In order to keep a wave synchronized in a laser, any change to the cavity length ($L_0$) must be proportional to a change in wavelength of the light in the cavity.

Figure 10:
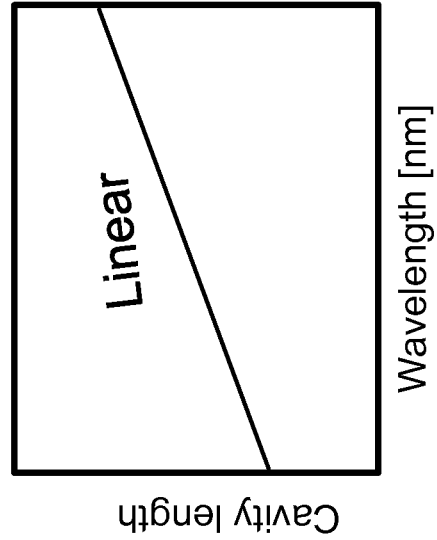
FIG. 10 depicts a graph that demonstrates the relationship between the cavity length and wavelength for achieving synchronization in accordance with an illustrative embodiment.

FIG. 10 depicts a graph that demonstrates the relationship between the cavity length and wavelength for achieving synchronization in accordance with an illustrative embodiment. Again, in order to properly synchronize a laser in a cavity, the wavelength (or an integral multiple of the wavelength) must match the cavity length. Accordingly, the systems and methods disclosed herein advantageously provide for a tunable external cavity laser that can automatically adjust the cavity length using a chirped mirror. The systems and methods disclosed herein are further tunable because ring filters or MEMS filters may be used to further adjust a cavity length, and wavelength may also be adjusted. Advantageously, all of these tuning and adjustment methods can be accomplished without changing the location of physical components of the systems disclosed herein. This also aids in the synchronization process, because it is less likely components will be bumped, displaced, or dislocated, which could further complicate the synchronization process. Furthermore, the physical components of a laser as disclosed herein may be more securely constructed and fastened together because the components are not necessarily physically moved in relation to each other. However, in some alternative embodiments that include components disclosed herein, physical movement or calibration of laser components may still occur.

Figure 11:
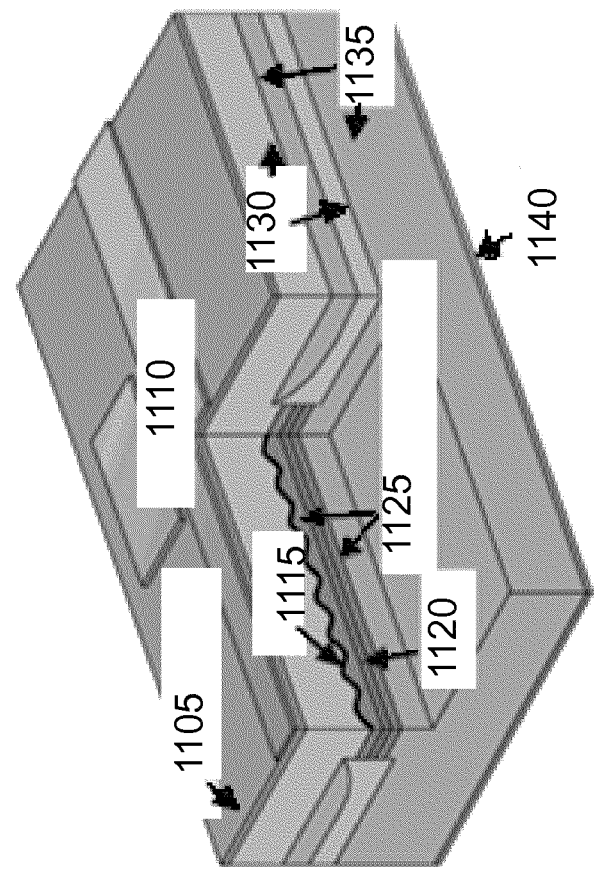
FIG. 11 depicts a gain area and chirped mirror in the same semiconductor that may be used in an external cavity laser in accordance with an illustrative embodiment.

FIG. 11 depicts a gain area and chirped mirror in the same semiconductor 1100 that may be used in an external cavity laser in accordance with an illustrative embodiment. This is an example of a semiconductor chip that may be used in the embodiment shown by FIG. 3. The semiconductor 1100 includes a contact layer 1105 with a p-electrode 1110 disposed on the contact layer 1105 and an n-electrode layer 1140 on the bottom of the semiconductor 1100.

The semiconductor 1100 also includes a grating 1115 where light may be selectively reflected as disclosed herein. The semiconductor 1100 also includes a waveguide layer 1125 and a multi-quantum well (MQW) 1120. A gain area in the semiconductor 1100 includes p-InP layers 1130 and n-InP layers 1135.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments.

While certain embodiments have been illustrated and described, it should be understood that changes and modifications can be made therein in accordance with ordinary skill in the art without departing from the technology in its broader aspects as defined in the following claims.

The embodiments, illustratively described herein may suitably be practiced in the absence of any element or elements, limitation or limitations, not specifically disclosed herein. Thus, for example, the terms "comprising," "including," "containing," etc. shall be read expansively and without limitation. Additionally, the terms and expressions employed herein have been used as terms of description and not of limitation, and there is no intention in the use of such terms and expressions of excluding any equivalents of the features shown and described or portions thereof, but it is recognized that various modifications are possible within the scope of the claimed technology. Additionally, the phrase "consisting essentially of" will be understood to include those elements specifically recited and those additional elements that do not materially affect the basic and novel characteristics of the claimed technology. The phrase "consisting of" excludes any element not specified.

The present disclosure is not to be limited in terms of the particular embodiments described in this application. Many modifications and variations can be made without departing from its spirit and scope, as will be apparent to those skilled in the art. Functionally equivalent methods and compositions within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds compositions or biological systems, which can of course vary. It is also to be understood that the terminology used herein is for the purpose of describing particular embodiments only, and is not intended to be limiting.

As will be understood by one skilled in the art, for any and all purposes, particularly in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like, include the number recited and refer to ranges which can be subsequently broken down into subranges as discussed above. Finally, as will be understood by one skilled in the art, a range includes each individual member.

All publications, patent applications, issued patents, and other documents referred to in this specification are herein incorporated by reference as if each individual publication, patent application, issued patent, or other document was specifically and individually indicated to be incorporated by reference in its entirety. Definitions that are contained in text incorporated by reference are excluded to the extent that they contradict definitions in this disclosure.

Other embodiments are set forth in the following claims.

What is claimed is:

1. An external cavity tunable laser system comprising:
   an external cavity;
   a substrate, wherein a gain region is disposed on the substrate;
   a chirped grating reflector having a reflection range to reflect wavelengths of light between a shorter wavelength $\lambda_s$ and a longer wavelength $\lambda_L$, wherein the wavelengths of light are reflected at different positions of reflection in the chirped grating reflector, and wherein a first position of the chirped grating reflector that reflects light of the shorter wavelength $\lambda_s$ is oriented closer to the gain region than a second position of the chirped grating reflector that reflects light of the longer wavelength $\lambda_L$; and
   a tunable filter, wherein:
      a cavity length of the external cavity tunable laser system is defined by at least a first length of the chirped grating reflector, a second length of the gain region, and a third length of the tunable filter,
      the cavity length has an inherent external cavity longitudinal mode,
      the tunable filter and the chirped grating reflector are configured to synchronize to the inherent external cavity longitudinal mode over a tuning range of the tunable filter and over the reflection range of the chirped grating reflector, and
      the tunable filter and the chirped grating reflector are fixed with respect to the gain region.

2. The external cavity tunable laser system of claim 1, wherein the inherent external cavity longitudinal mode is defined at least in part by the cavity length.

3. The external cavity tunable laser system of claim 1, wherein an optical length corresponding to the first length of the chirped grating reflector is variable depending at least on a wavelength of light present in the external cavity.

4. The external cavity tunable laser system of claim 1, wherein an optical length corresponding to the third length of the tunable filter is variable based on a tuning level of the tunable filter.

5. The external cavity tunable laser system of claim 1, wherein a physical cavity length of the external cavity length is fixed, but an optical cavity length can be varied by the chirped grating reflector or the tunable filter.

6. The external cavity tunable laser system of claim 1, wherein the chirped grating reflector is a linearly chirped grating reflector.

7. The external cavity tunable laser system of claim 1, wherein the chirped grating reflector is disposed on the substrate.

8. The external cavity tunable laser system of claim 1, wherein the substrate comprises an active waveguide.

9. The external cavity tunable laser system of claim 8, wherein the chirped grating reflector is structured on a horizontal surface of the active waveguide.

10. The external cavity tunable laser system of claim 8, wherein the chirped grating reflector is structured on a vertical surface of the active waveguide.

11. The external cavity tunable laser system of claim 1, wherein the chirped grating reflector and the substrate are monolithically integrated.

12. The external cavity tunable laser system of claim 1, wherein the tunable filter is a tunable ring filter configured to change an optical length corresponding to the third length.

13. The external cavity tunable laser system of claim 1, wherein the tunable filter is a micro-electro-mechanical system (MEMS) filter configured to change a wavelength of light present in the external cavity.

14. A method comprising:
   generating light in an external cavity, wherein the light has a wavelength and the external cavity has a cavity length;
   amplifying the light at a gain region disposed on a substrate;
   reflecting the light at a chirped grating reflector having a reflection range to reflect wavelengths of light between a shorter wavelength $\lambda_s$ and a longer wavelength $\lambda_L$, wherein the wavelengths of light are reflected at different positions of reflection in the chirped grating reflector, and wherein a first position of the chirped grating reflector that reflects light of the shorter wavelength $\lambda_s$ is oriented closer to the gain region than a second position of the chirped grating reflector that reflects light of the longer wavelength $\lambda_L$; and
   tuning a tunable filter such that the light is synchronized according to an inherent external cavity longitudinal mode of the external cavity, wherein:
      the external cavity comprises a cavity length defined by at least a first length of the chirped grating reflector, a second length of the gain region, and a third length of the tunable filter;
      the tunable filter and the chirped grating reflector are configured to synchronize to the inherent external cavity longitudinal mode over a tuning range of the tunable filter and over the reflection range of the chirped grating reflector; and
      the tunable filter and the chirped grating reflector are fixed with respect to the gain region.

15. The method of claim 14, wherein the inherent external cavity longitudinal mode is defined at least in part by the cavity length.

16. The method of claim 14, wherein tuning the tunable filter comprises changing the wavelength of the light.

17. The method of claim 14, wherein tuning the tunable filter comprises changing an optical length corresponding to the third length of the tunable filter.

18. The method of claim 14, wherein the substrate comprises an active waveguide.

19. The method of claim 14, further comprising tuning the tunable filter such that the wavelength of the light or an integral multiple of the wavelength of the light is substantially the same as the cavity length.

20. The method of claim 14, wherein an optical length corresponding to the first length of the chirped grating reflector is variable depending at least on a wavelength of light present in the external cavity.

* * * * *